(12) United States Patent
Dutta

(10) Patent No.: US 8,106,289 B2
(45) Date of Patent: Jan. 31, 2012

(54) HYBRID PHOTOVOLTAIC DEVICE

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 484 days.

(21) Appl. No.: 12/006,154

(22) Filed: Dec. 31, 2007

(65) Prior Publication Data

US 2009/0165844 A1    Jul. 2, 2009

(51) Int. Cl.
*H01L 31/00*    (2006.01)

(52) U.S. Cl. ........ 136/255; 136/252; 136/258; 136/260; 136/261; 136/262; 136/263; 136/264; 136/265; 977/948

(58) Field of Classification Search .................. 136/255, 136/252, 258, 260–265; 977/948
See application file for complete search history.

(56) References Cited

U.S. PATENT DOCUMENTS

| | | | |
|---|---|---|---|
| 4,377,723 A * | 3/1983 | Dalal .............................. | 136/249 |
| 6,649,824 B1 * | 11/2003 | Den et al. ....................... | 136/256 |
| 7,227,066 B1 * | 6/2007 | Roscheisen et al. ............ | 257/40 |
| 2005/0098205 A1 * | 5/2005 | Roscheisen et al. .......... | 136/263 |
| 2006/0207647 A1 * | 9/2006 | Tsakalakos et al. .......... | 136/256 |
| 2008/0047604 A1 * | 2/2008 | Korevaar et al. .............. | 136/258 |
| 2008/0135089 A1 * | 6/2008 | Tsakalakos et al. .......... | 136/248 |

* cited by examiner

Primary Examiner — Basia Ridley
Assistant Examiner — Allison Bourke

(57) ABSTRACT

A hybrid photovoltaic device comprising a plurality of nanostructures embedded in a matrix of a photosensitive material including one or more layers. A combination of innovative structural aspects of the hybrid photovoltaic device results in significant improvements in collection of incident light from the solar spectrum, better absorption of light, and better collection of the photo-carriers generated in response to the incident light, thereby improving efficiency of the hybrid photovoltaic device.

16 Claims, 12 Drawing Sheets

600A

600B

HYBRID PHOTOVOLTAIC DEVICE

CROSS-REFERENCE TO RELATED APPLICATIONS

Not Applicable

STATEMENT REGARDING FEDERALLY SPONSORED RESEARCH OR DEVELOPMENT

Not Applicable.

FIELD OF THE INVENTION

This invention is related to photovoltaic power generation, and in particular to photovoltaic power generation in a multilayered hybrid photovoltaic device comprising a nanostructure embedded in a matrix of another material exhibiting photovoltaic effect. The hybrid photovoltaic device integrates conventional nanostructure technology with the conventional photovoltaic device technology for high efficiency.

BACKGROUND OF THE INVENTION

Photovoltaic power generation is considered as an alternative for conventional power generation, for example from fossil fuels and nuclear energy. It is particularly vied for its minimal environmental impact as a 'clean energy' source. Photovoltaic power is generated in a photovoltaic device, popularly known as a solar cell. In order for photovoltaic power generation to be viable as a future source, reliability and cost of photovoltaic energy conversion must be comparable with the conventional power generation sources. Currently available technologies, especially the low cost photovoltaic energy conversion devices are lagging significantly, in both these areas.

Typically, a photovoltaic energy conversion apparatus comprises a plurality of photovoltaic devices arranged in modules, wherein one or more modules are connected together in a support structure, depending upon power requirement for a given application. A major fraction of cost of generating photovoltaic power lies in manufacturing photovoltaic devices and modules. Therefore, in order to lower the cost of photovoltaic power generation, it is imperative to reduce the cost of photovoltaic devices.

Basic principles of photovoltaic energy conversion can be described in reference with FIG. 1A, representing a cross section view 100A of the most widely understood generic prior-art planar, surface illuminated photovoltaic device. The photovoltaic device as represented by 100A comprises a silicon substrate 102, having a p-type doping, a first layer (103) having p-type doping higher than the substrate (102) doping, and the second layer (105) having a n-type doping that is relatively higher than the p-type doing level of the first layer (103). The interface between the first layer (103) and the second layer (105) forms a p-n junction having a built-in electric field. The bottom surface of the substrate has a metal layer coating 101 forming a first electrode of the photovoltaic device. The top surface of the layer 105 is coated with a second metal layer 106 forming a second electrode of the photovoltaic device. The first and second electrodes have opposite polarities.

In operation, the silicon photovoltaic device absorbs energy from the incident photon flux represented by a plurality of arrows 107, and generates a plurality of photo-carriers 108 and 109 (only one pair labeled for clarity) within the photovoltaic device. In general, photo-carriers are polar meaning that each photo-carrier has either a positive charge or a negative charge associated with it (for simplicity only one carrier of each polarity is shown).

In the silicon photovoltaic device shown in 100A for example, photo-carriers in the first layer (103) are predominantly holes (each one having a positive charge), and in the second layer (105) the photo-carriers are predominantly electrons (each having a negative charge). The photo-carriers that reach the p-n junction get separated by the built-in electric field and are subsequently collected by the electrodes (101 and 106) having the like polarity, respectively, thereby generating a photocurrent.

Those skilled in the art will appreciate that the generation of photo-carriers in the silicon layers (103 and 105) is not uniform. For example, and as shown in FIG. 1B, 100B schematically represents a photon flux profile 111 incident on the metal layer 106, as it penetrates down the photovoltaic device in the vertical direction. Therefore, maximum photo-carrier generation is near the surface and it reduces as lower and lower photon flux reaches to the layers 105 and 103 below the surface. Therefore, a thin photovoltaic device having the p-n junction closer to the surface is advantageous, such that the maximum number of photo-carriers separate in the junction and contribute to the photocurrent generation.

In another type of a prior art device, thin films of materials having higher absorption coefficient are utilized, where the p-n junction region may be extended deeper into the device for better efficiency. One example of such a prior art a-Si device is schematically shown in FIG. 2, wherein 200 is a multi-layer planar a-Si photovoltaic device. It is important to note that a thin film of about 1-5 micrometer of a-Si can absorb about 90% or more of the incident light.

The prior art photovoltaic device 200 is a multilayered structure comprising (in vertical order) a transparent substrate (201), a layer of a transparent conductor (202), a layer of doped a-Si (203), a layer of intrinsic (undoped) a-Si (204), a second layer of doped a-Si (205) followed by a layer of metal (206). In this example the photovoltaic device receives the photon flux represented by a plurality of arrows (207) from the bottom surface of the transparent substrate. The doping in the two doped a-Si layers is of opposite kind thereby creating p-i-n junction (between the layers 203-205) instead of a p-n junction described in reference with FIG. 1A.

In operation, the photovoltaic device 200 upon receiving the incident photon flux (207) at the bottom surface of the transparent substrate (201), generates a plurality of photo-carriers (208 and 209, only one pair labeled for clarity) in all three a-Si layers (203-205) wherein each photo-carrier has either a positive or a negative charge associated with it. The photo-carriers are separated in a built-in field of the p-i-n junction and subsequently diffuse towards respective electrodes (the transparent conductor layer 202, and the metal layer 206) according to the charge on the photo-carrier. The efficiency of the photovoltaic device 200 is seriously affected by a partial loss of the plurality of photo-carriers (208 and 209) due to their small diffusion length within the a-Si layers (203-205).

It is well known to those skilled in the art that the efficiency of absorption of light, and in particular absorption of the sunlight in different materials are different for the reasons outlined below—a) the photon flux in each section of the solar spectrum is not the same, and b) different materials absorb light from different sections of the solar spectrum depending upon their bandgap '$E_g$' and absorption coefficient '$\alpha$'. For example, while several micrometer thick films or sheets of c-Si or poly-Si are necessary for absorbing sufficient sunlight from the solar spectrum, only about one micrometer thick film of a-Si is sufficient for absorbing about 90% or more light from the solar spectrum.

Accordingly, performance of different photovoltaic devices are compared in terms of photovoltaic conversion efficiency (or efficiency), which depends on several factors including but not limited to, a) incident photon flux, b) absorption of photon flux within the photovoltaic device, c) photo-carrier generation, d) separation of photo-carriers in the p-n junction, e) efficient diffusion of carriers to the respective electrodes, and f) efficient collection of photo-carriers by the respective electrodes.

For example, efficiency of a heterojunction photovoltaic device made from III-V alloy semiconductors is about 25-28%, efficiency for a conventional homojunction c-Si or poly-Si photovoltaic device is between 12-17%, and efficiency of a multi-layer a-Si photovoltaic device is between 8-10%, respectively. Module efficiencies tend to be 0.5% to 2% lower, based on the total area of the module.

The cost of manufacturing photovoltaic devices mainly depends on the materials as well as processing cost. For example, high efficiency photovoltaic devices that mainly utilize single crystalline materials such as, crystalline silicon (c-Si), poly-crystalline silicon (poly-Si), III-V alloy semiconductors including but not limited to, GaAs, InP, GaAlAs, GaInAsP, GaInAs, and their combinations thereof in single or multiple homojunctions, heterojunctions, or tandem photovoltaic devices are the most expensive ones.

However, these types of photovoltaic devices are not cost effective in power generation for terrestrial applications such as residential, industrial, and commercial power generation that require better reliability and higher efficiency than applications in consumer electronics. Therefore, some low cost materials and technologies that are being pursued for providing photovoltaic devices at a reasonable cost are, thin films of c-Si including microcrystalline silicon (micro-Si), poly-Si, and amorphous silicon (a-Si). These materials are also adaptable for low cost processing technologies that are suitable for mass production and considerable progress has been made in this area as well to lower the overall cost of manufacturing photovoltaic devices.

While other low cost materials, such as II-VI semiconductors including but not limited to, cadmium sulfide (CdS)/cadmium telluride (CdTe) and copper indium diselenide (CIS) are useful for photovoltaic devices, they have adverse environmental impact, and are therefore not a viable choice for 'clean energy'. These materials may be used alone or, in combination with other materials including but not limited to, other semiconductors, as well as photosensitive polymers. As a matter of design choice and compatibility with the materials utilized in constructing a device, the device structure may include but is not limited to, single and multiple homojunctions, heterojunctions, or a suitable combination thereof.

In this application a design of a hybrid photovoltaic device utilizing nanostructures embedded in a matrix of another material exhibiting photovoltaic effect is disclosed. Those skilled in the art will appreciate that the principles of the invention disclosed herein, and further defined by the scope of claims to follow, are merely illustrative and are not construed to be limited to specific examples of structure and materials used to explain the principles in this document.

SUMMARY OF THE INVENTION

One objective of this invention is to provide a design of a photovoltaic device that exhibits improved collection of the sunlight, thereby absorbing more sunlight from the solar spectrum. Accordingly, a hybrid photovoltaic device (hereinafter hybrid device) disclosed in this invention utilizes a plurality of nanostructures (hereinafter nanostructures) embedded in a matrix of another material exhibiting photovoltaic effect, including but not limited to crystalline semiconductor, amorphous semiconductor, photosensitive polymers and/or a combination thereof. A combination of different materials in the nanostructures and the matrix allows collection of light from different sections of the solar spectrum. Large effective surface area to volume ratio of the plurality of nanostructures of the hybrid device according to the principles of the invention is advantageous.

A second objective of this invention is to provide a photovoltaic device that exhibits high conversion efficiency. Accordingly, a hybrid device disclosed in this invention utilizes III-V alloy semiconductor nanostructures comprising a plurality of cylinders, or pillars, vertically projecting upwards from a substrate, embedded in a matrix of another semiconductor exhibiting photovoltaic effect, including crystalline, microcrystalline or polycrystalline semiconductor, and/or amorphous semiconductor. Advantageously, such a structure absorbs photon flux from a larger section of the solar spectrum thereby, improving efficiency of collection and conversion of the photon energy into electrical energy. An exemplary system according to the principles of this invention utilizes indium phosphide (InP) nanostructures embedded in a matrix of a-Si.

A third objective is to provide a design of a photovoltaic device that effectively utilizes the large reflectivity of semiconductor surfaces. Accordingly, one example of a hybrid device disclosed in this invention utilizes III-V alloy semiconductor nanostructures comprising a plurality of tapered cylinders embedded in a matrix of a-Si, such that the photon flux incident on the tapered surface of the plurality of tapered cylinders along the length, reflect a portion of the photon flux into the matrix of a-Si thereby, increasing the effective photon flux incident upon the matrix of a-Si.

Another objective of this invention is to provide efficient collection of photo-carriers generated in nanostructures as well as in a matrix embedding the nanostructures. Accordingly, a hybrid device is designed such that the photo-carriers generated in the matrix diffuse into the adjacent nanostructures where the diffusion length of the photo-carriers is substantially longer as compared to the diffusion length of the photo-carriers within the matrix thereby, improving the collection of photo-carriers respective electrodes of the photovoltaic device.

Yet another objective of this invention is to provide a high efficiency photovoltaic device. Accordingly, a hybrid device disclosed in this invention combines the principles of efficient photon collection with principles of efficient photo-carrier collection to improve overall efficiency of the hybrid device.

Yet another objective of this invention is to provide photovoltaic power at a cost comparable with the conventional energy sources. Accordingly, a hybrid device disclosed in this invention by way of example, utilizes a very small amount of III-V alloy semiconductor in the nanostructures embedded in a matrix comprising a relatively large amount of an amorphous semiconductor. Since III-V alloy semiconductors are more expensive than the amorphous semiconductor, the overall cost of the hybrid device is significantly reduced while the efficiency of the hybrid device is high.

Yet another objective of this invention is to provide photovoltaic cell which can be fabricated on the low-cost substrate other than the semiconductor, such as glass, ceramic, sapphire, polymer, or metal substrate. The photovoltaic cell comprises array of III-V based nanostructures, formed on the glass substrate and the amorphous/poly/microcrystal/crystal semiconductor. The objective is to reduce the cost of photovoltaic power generation (a) by using (low-cost substrate, and (b) also enhancing the conversion efficiency by using of III-V based nanostructures.

Another objective of this invention is to provide manufacturing processes for hybrid devices that are commensurate with currently available technologies of nanostructure formation as well as photovoltaic device fabrication while keeping provision to incorporate future advances in materials and processing technologies. Accordingly, this invention discloses manufacturing processes for hybrid devices utilizing nanostructures constructed from conventional nanostructure fabrication process, or by transferring pre-fabricated nanostructures from another substrate and integrating the same in a matrix of another material exhibiting photovoltaic effect, such materials including but not limited to, crystalline semiconductor, amorphous semiconductor, photosensitive polymers and/or a combination thereof, using conventional manufacturing processes for the matrix.

BRIEF DESCRIPTION OF THE INVENTION

Other aspects, features, and advantages of the present invention will become apparent from detailed description and accompanying claims, in view of a brief description of accompanying drawings in which:

DETAILED DESCRIPTION OF THE INVENTION

Figures 1A, 1B:
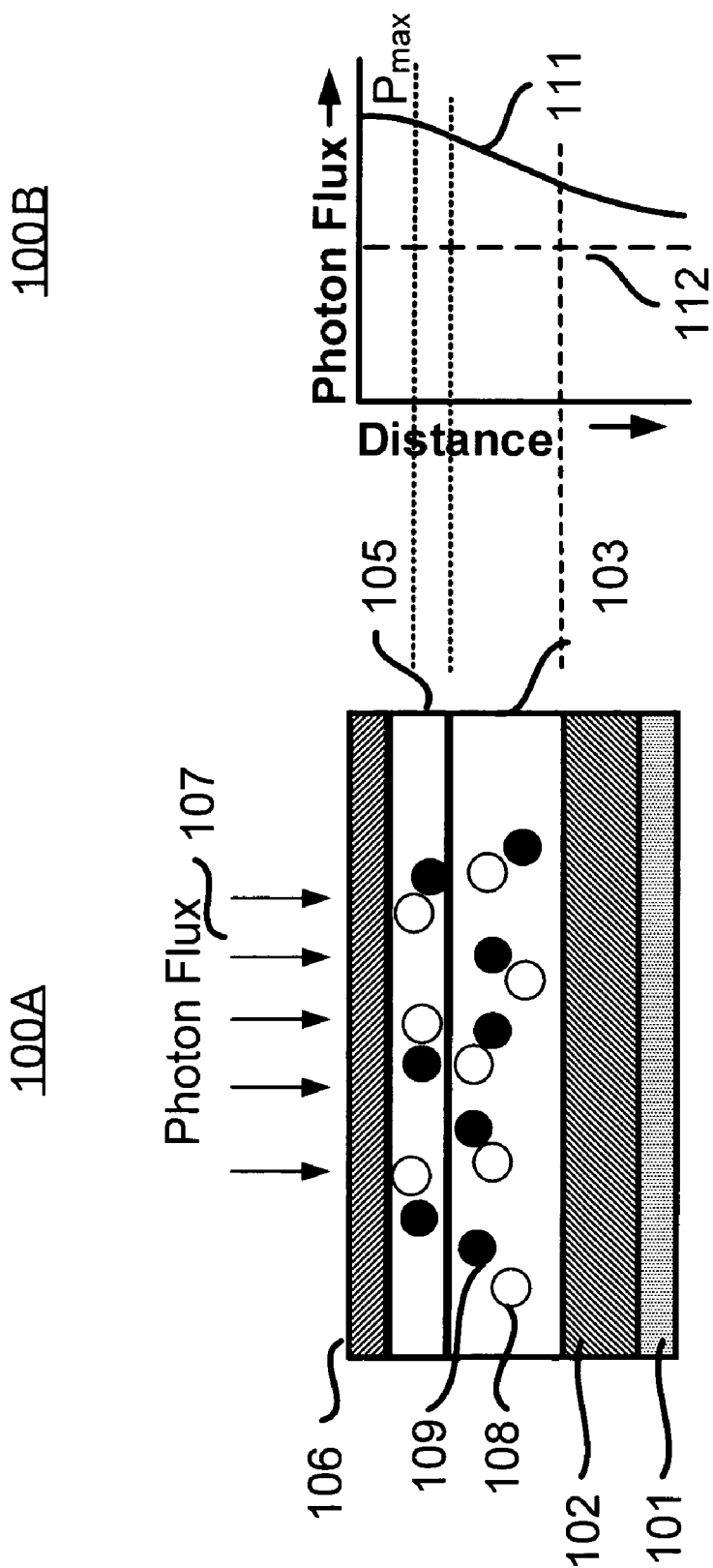
FIG. 1A is a schematic representation of the photovoltaic process in a prior art photovoltaic device.
FIG. 1B is a schematic representation of variation of photon flux within a material.

This invention was first presented as a proposal (Phase-I SBIR Proposal # 0741061) for a research grant to National Science Foundation on Jun. 13, 2007. The principles of the invention may be appreciated by the description of exemplary embodiments disclosed in the specification in view of the accompanying drawing FIGS. 3-11 in which like parts are indicated by like reference numerals in all the drawing figures to avoid repetitions in describing them.

Figure 2:
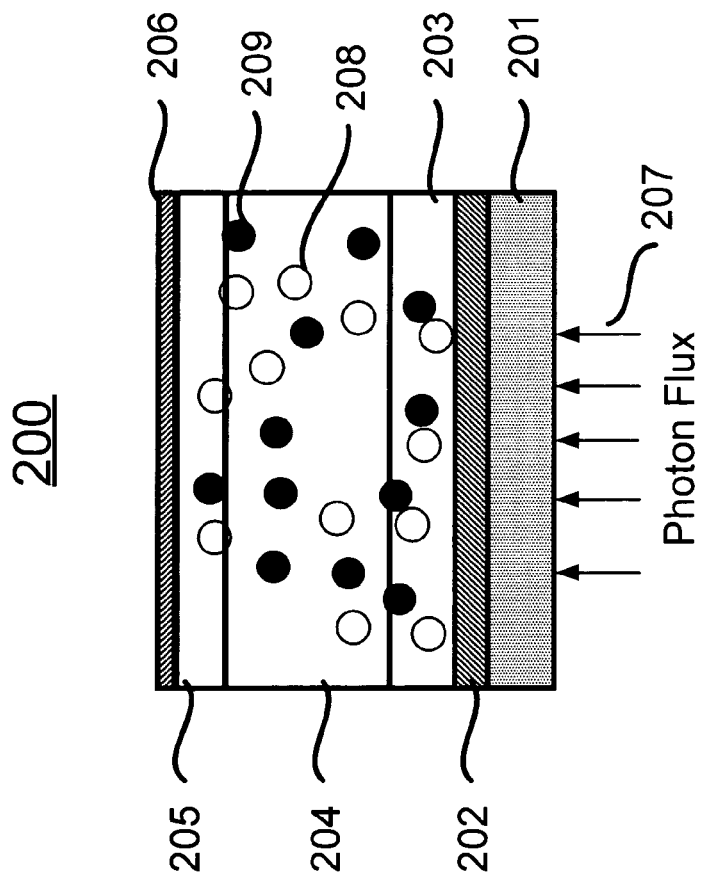
FIG. 2 is a schematic representation of a prior art a-Si photovoltaic device.
Figure 3A:
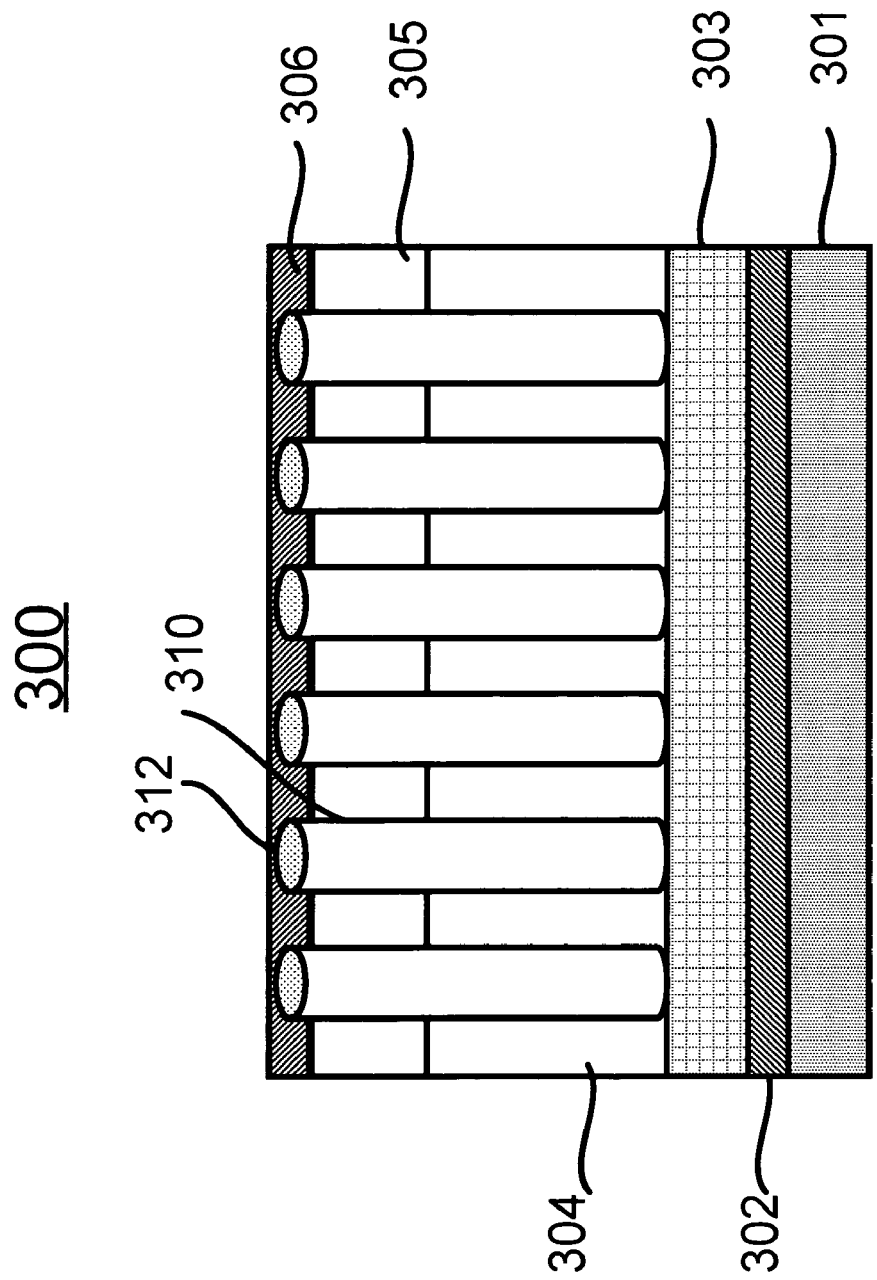
FIG. 3A is a schematic representation of a hybrid device constructed according to the principles of this invention.

FIG. 3A shows a cross sectional view (300) of an exemplary planar hybrid device according to the principles of the invention. The device structure is similar to that of a conventional planar a-Si device shown earlier in FIG. 2, wherein like parts are indicated with like reference numerals. More specifically, the hybrid device (300) constructed on a substrate (301) comprises multiple layers including a transparent conductor layer (302), a first layer (303), a plurality of nanostructures represented as 310, (only one nanostructure is labeled for clarity), a second layer (304), and a third layer (305), such that the nanostructures are embedded in a matrix formed by the second, and third layers.

A plurality of a metal catalyst layers (312, only one labeled for clarity) arranged in a two dimensional periodic array over the first layer, form a plurality of nucleation sites over the first layer. The plurality of nanostructures are constructed at these nucleation site using a material which is different from materials utilized in constructing the first, second and third layers. One or more of the first, second, and third layer may be constructed from the same material as well. According to one aspect of the invention, one or more of the first, second and third layers, and preferably the first and third layers may optionally be doped to enhance their respective electrical conductivities. According to another aspect of the invention, the doping in one or more of the first, second and third layer may be of a different type than the rest of the first, second and third layers. The transparent conductor layer (302) forms a first electrode, whereas a metal layer (306) covering the third layer and the top of the nanostructures forms a second electrode of the photovoltaic device.

It should be understood that variation in the device structure shown in FIG. 3A are well within the scope of the invention. Accordingly, in FIG. 3B, a schematic of a second embodiment 300B is shown where like parts are indicated by like reference numerals. The hybrid device shown in this embodiment resembles the hybrid device shown in FIG. 3A in all respects except, a first conducting layer (not shown) is not constructed over the substrate (301). Instead, the first conducting layer is constructed over the first layer (303). In that case, it will be necessary to dope the first layer such that the electrical conductivity of the layer is significantly enhanced to reduce the contact resistance between the first layer and the first conducting layer.

Figure 3B:
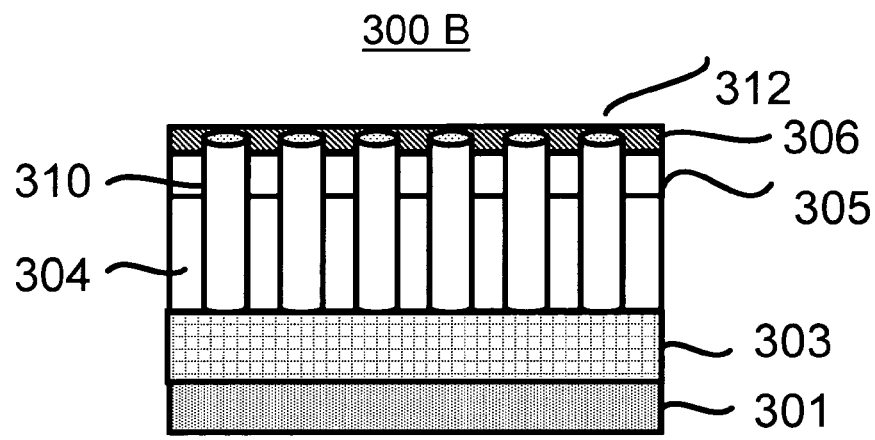
FIG. 3B is a schematic representation of a second embodiment of a hybrid device constructed according to the principles of this invention.
Figure 3C:
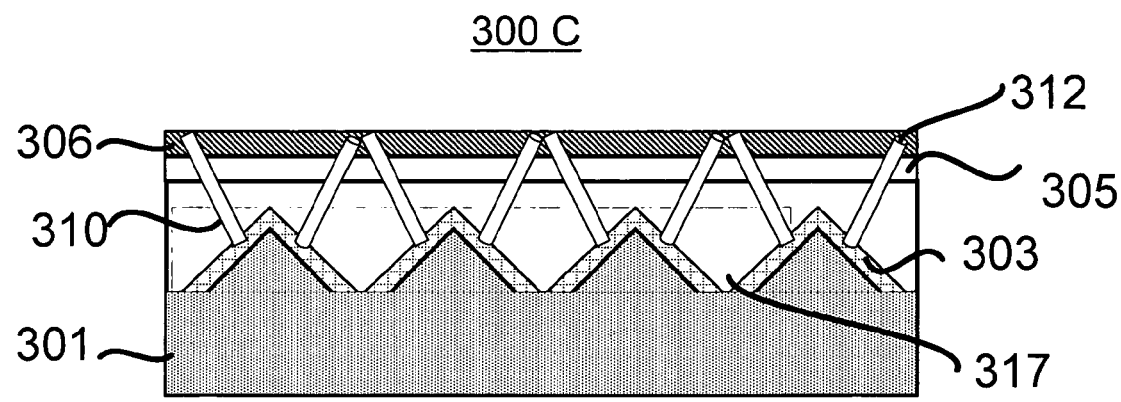
FIG. 3C is a schematic representation of a third embodiment of a hybrid device constructed according to the principles of this invention.

FIG. 3C schematically represents a third embodiment of a hybrid device 300C where like parts are indicated by like reference numerals and the structure will not be discussed in detail except for the differences in the hybrid devices shown in FIGS. 3A and 3C. In this embodiment the hybrid device 300C is constructed on a substrate (301) having a pre-fabricated pattern. More specifically, a periodic pattern including but not limited to, a plurality of V-grooves (317, only one labeled for clarity) is etched in to the substrate prior to constructing the first layer (303).

Like in the embodiment shown in FIG. 3B, a first conducting layer is constructed over the first layer (303). Similar to the hybrid device described in reference with FIG. 3A, the first layer is doped such that the electrical conductivity of the layer is significantly enhanced to reduce the contact resistance between the first layer and the first conducting layer. It should be noticed that a plurality of nanostructures (310) grown on the V-grooves, project perpendicular to the side walls of the V-grooves (317) instead of projecting vertically upwards from the surface of the first layer (303). However, this variation in design is well within the scope of the invention.

The pattern showing the plurality of V-grooves (317) is just an example and should not be construed to be excluding other periodic patterns, for example periodic ridges, trapezoids, etc. that have angled side walls and flat top surfaces. Advantages of patterned substrate are well known and well documented in the art and will not be discussed further.

In all other respect the hybrid device shown in FIG. 3C is substantially similar to that shown in FIG. 3B. Those skilled in the art will be able to distinguish that the hybrid devices shown in FIGS. 3A-3C differ from the prior art planar photovoltaic device shown in FIG. 2, in that the plurality of nanostructures are embedded in the matrix constructed from a different material. The hybrid device integrates a planar photovoltaic device with the plurality of nanostructures that are individual surface-enhanced devices. The advantages of the hybrid device described earlier will be apparent from the following discussion.

For the sake of simplicity, the following discussion refers to FIG. 3A only however, other embodiments shown in FIGS. 3B and 3C have substantially the same advantages. An advantage of the hybrid device shown in FIG. 3A is that materials utilized in constructing the plurality of nanostructures and the matrix are different having different bandgaps. Therefore the hybrid device absorbs light from a larger section of the solar spectrum. A first planar p-i-n junction having a built-in electric field, is formed by the first, second and third layers (303-305) similar to that described in reference with the prior art planar photovoltaic device shown in FIG. 2. In addition, there is a plurality of p-n surface junctions at the interface of the plurality of nanostructures and the embedding matrix thereby, providing additional built-in electric fields all around each of the plurality of nanostructures.

Figure 4:
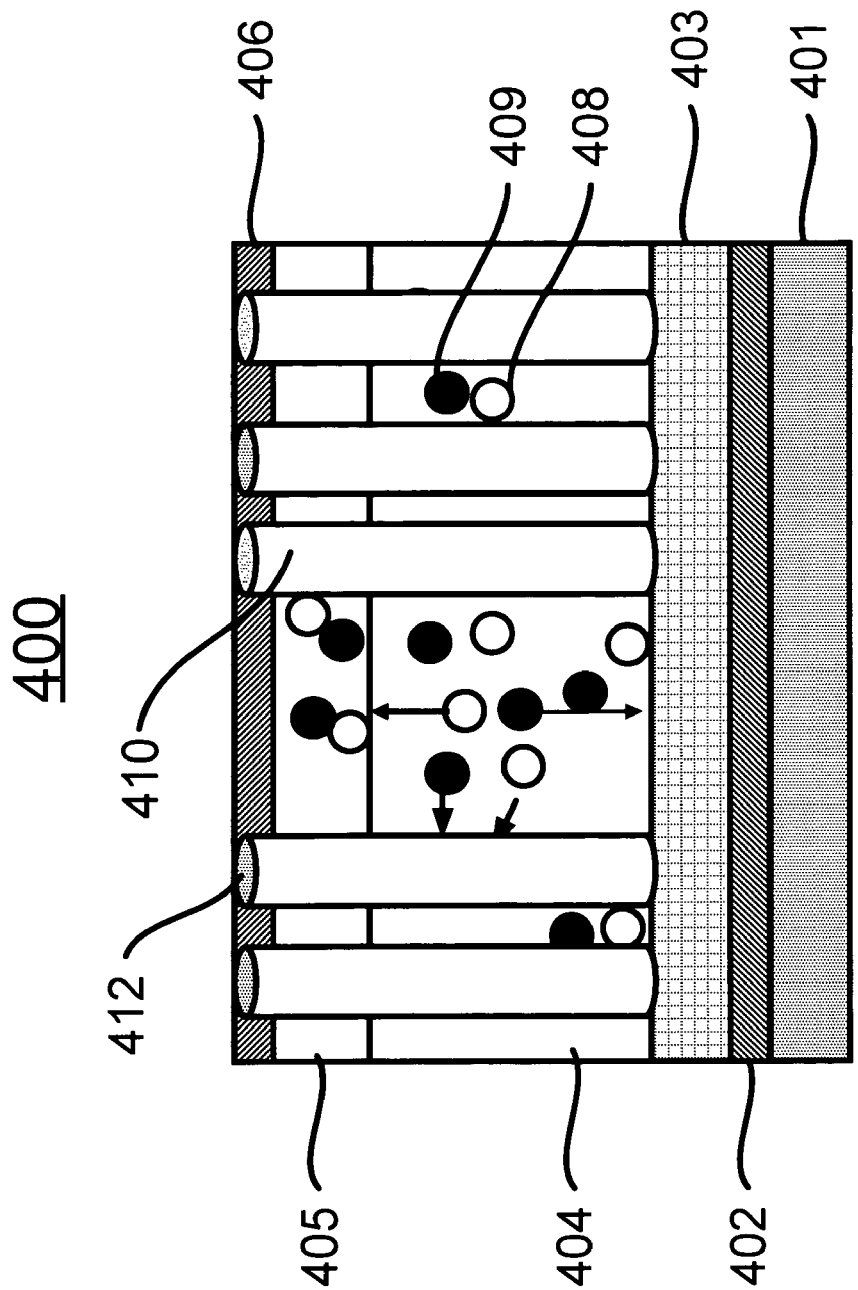
FIG. 4 is a schematic representation of diffusion of photogenerated carriers in a hybrid device constructed according to the principles of this invention.

The advantage of the additional surface junctions will be clear from the operation of the hybrid device to be described shortly. Referring now to FIG. 4, there it shows a hybrid device 400 similar to the one described in FIG. 3, wherein like parts are indicated by like reference numerals. Therefore, the features of the hybrid device 400 that are similar to those described earlier in reference with the hybrid device 300A will not be described again for simplicity.

Focusing now on the operation of the hybrid device, in response to a photon flux incident for example, on the bottom surface of the substrate (401), a plurality of photo-carriers (408 and 409) are generated in the plurality of nanostructures as well as in the embedding matrix. Each one of the plurality of photo-carriers has a charge associated with it, either positive or negative, but not both. For clarity, only one of each kind of photo-carriers are labeled in FIG. 4. In order to generate a photocurrent it is important that these photo-carriers are collected by the respective electrodes (302 and 306) according to their charge.

Each one of the plurality of photo-carriers move randomly in the matrix (304 and 305 layers for example) for example, shown by solid arrows however, the motion is not limited to specific directions shown herein. The plurality of photo-carriers (308 and 309) is not only separated by the built-in electric field of the first planar p-i-n junction, they are also separated by the built-in electric field of the surface junctions surrounding each of the plurality of nanostructures. As a result significant numbers of the photo-carriers that would have been otherwise lost due to recombination in the embedding matrix are efficiently separated by the surface junctions. Statistically, a significantly larger number of photo-carriers are therefore separated as compared to that separated in a prior art planar device described earlier in FIG. 2. Additional p-n junctions may be included within each one of the nanostructures for further increasing the probability of separating the photo-carriers within the nanostructures.

A second, but very significant advantage comes from the fact that the photo-carriers within the plurality of nanostructures have a larger diffusion length as compared to the diffusion length in the embedding matrix. Therefore, the photo-carriers that diffuse into any adjacent nanostructure from the embedding matrix, have a larger probability of being collected in the respective electrodes (402 and 406). As a result, loss of photo-carriers due to recombination within the embedding matrix is significantly reduced and collection of photo-carriers in the respective electrodes becomes more efficient. It should be noted that photo-carriers that are generated within the plurality of nanostructures already experience a larger diffusion length.

Those skilled in the art will be able to appreciate that, as a result of the these two advantages described in the previous sections, the hybrid device constructed according to the principles of this invention exhibits improved generation, and collection of photo-carriers. Therefore for the same amount of photon flux incident on a unit surface area, efficiency of the hybrid device is higher as compared to that of the prior art planar photovoltaic device described earlier in FIG. 2.

In the exemplary embodiment shown in FIG. 4, the substrate (401) is a transparent substrate, for example glass, whereas the transparent conductor layer (402) is constructed from indium tin oxide (ITO). The nanostructures (410) are constructed from III-V alloy semiconductor, whereas the embedding matrix including the first, second and third layers (403-405) is constructed from an amorphous semiconductor. In addition, one or more of the first and third amorphous semiconductor layers (403 and 405) may be uniformly doped to enhance their conductivities.

In FIGS. 3A and 4, the first conducting layer (302 and 402) is shown under the first layer (303 and 403). Alternatively, the first conducting layer may be constructed over the first layer (303 and 403). In that case it is necessary to dope the first layer (403) significantly, such that the electrical conductivity of the first layer (403) is significantly enhanced and reduce the contact resistance between the first layer and the first conducting layer.

Referring again to FIG. 4, the doping in one or more of the first and the third amorphous semiconductor layers (403 and 405) may be of the same type or different types (for example p and n-type doping, respectively). Alternatively, the doping in one or more of the first and third layers may be graded, for example the doping level in the first layer adjacent to the first second electrode (402) is higher as compared to the doping level in the first layer adjacent to the second layer (404). The specific materials listed here are only meant to be illustrative for explaining the basic design concepts of the hybrid device, and should not be construed as limiting. Other aspects of the invention related to materials that may be utilized to construct the hybrid device, will be discussed later in the specification.

Figure 5A:
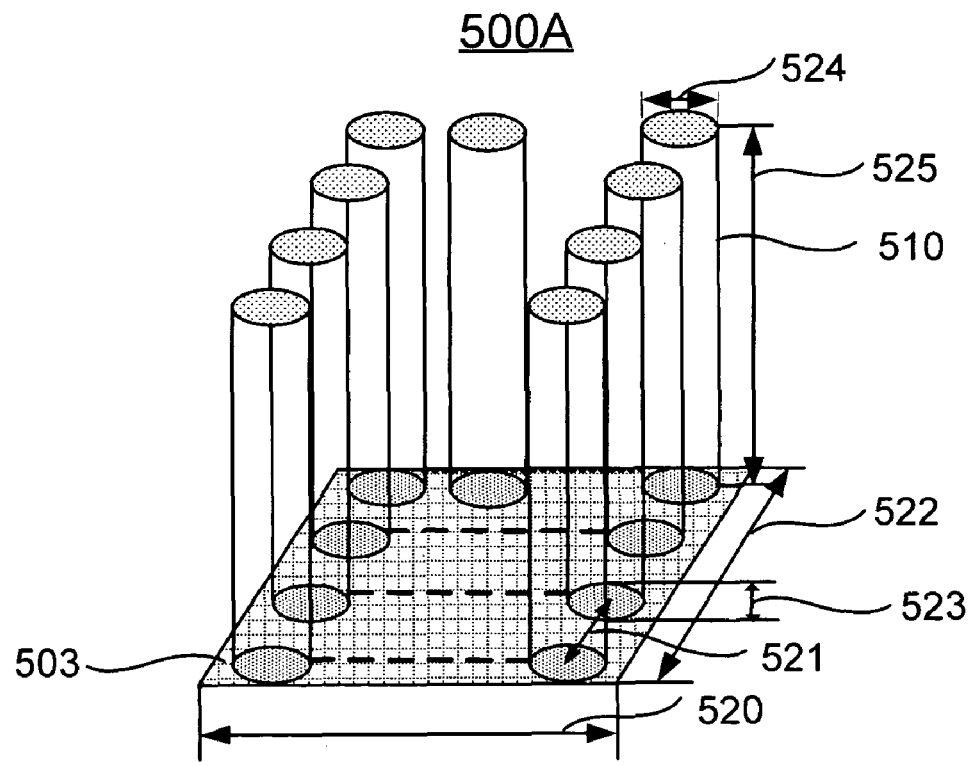
FIG. 5A represents a topological view of nanostructures comprising a plurality of elongated bodies resulting in effective surface area enhancement.
Figure 5B:
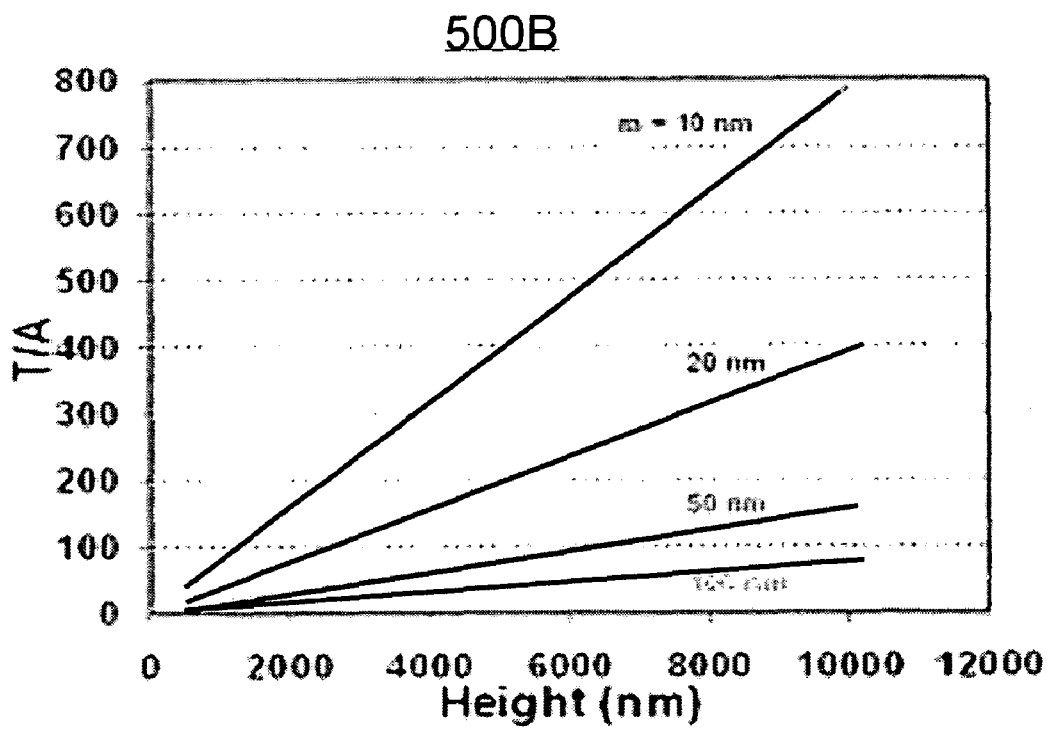
FIG. 5B shows a simulation result depicting relative enhancement in effective surface area as a function of a nominal height of the nanostructures, whereas a nominal diameter of the nanostructures is a parameter.

One important design aspect of the hybrid device is the shape of the plurality of nanostructures, which can be explained in view of FIGS. 5A and 5B, wherein FIG. 5A depicts a topologic view (500A) of the plurality of nanostructures similar to those shown earlier in FIGS. 3 and 4, wherein like parts are indicated by like reference numerals for clarity. More specifically, the plurality of nanostructures (510) are a plurality of elongated bodies shaped like but not limited to, cylinders, pillars, or wires, also known as nanocylinders, nanopillars or nanowires, respectively. The plurality elongated bodies is shown to be arranged in a 2-dimensional array on a first layer (503) defined by two sides of a square (represented as 520 and 522) in this example. It should be understood that the square shape of the first layer is only illustrative and is not construed to be essential. Any other shape of the first layer is well within the scope of the invention.

The plurality of elongated bodies are three dimensional, each one projecting vertically upwards from the surface of the first layer (503), having a nominal height (525), a nominal footprint diameter (523) at the first layer (503), and a nominal top end diameter (524). In this example the nominal footprint diameter (523) is shown to be equal to the nominal top end diameter (524). However, it is not necessary to be so. The center-center spacing (521) between the adjacent one of the plurality of elongated bodies is assumed to be the same as the nominal footprint diameter. It must be understood that the plurality of elongated bodies may not be as perfectly arranged as shown in this schematic example.

When the nominal height (525) is substantially larger than the nominal footprint diameter (523), then the ratio of the total surface area to the total footprint area of the elongated bodies is significantly large. Simulation results depicting the surface area enhancement is shown in a graph (500B) in FIG. 5B, wherein the ratio (T/A) of the total surface area to the total footprint area is plotted as a function of the nominal height (H) for a 1"×1" square area hybrid device similar to that depicted in FIGS. 3 and 4. It should be noted that the ratio is largest when the nominal footprint diameter (m) is small. If the nominal footprint diameter (m) is large, the advantage of surface area enhancement is not as much for the same nominal height (H).

Advantageously, enhancement in surface area of the hybrid device constructed according to the principles of this invention translates into light absorption over a larger surface area for the same amount of photon flux incident on the surface of the hybrid device. Therefore, conversion efficiency of the hybrid device shown in FIG. 3 is higher as compared to a prior art planar photovoltaic device shown in FIG. 2.

Figure 6A:
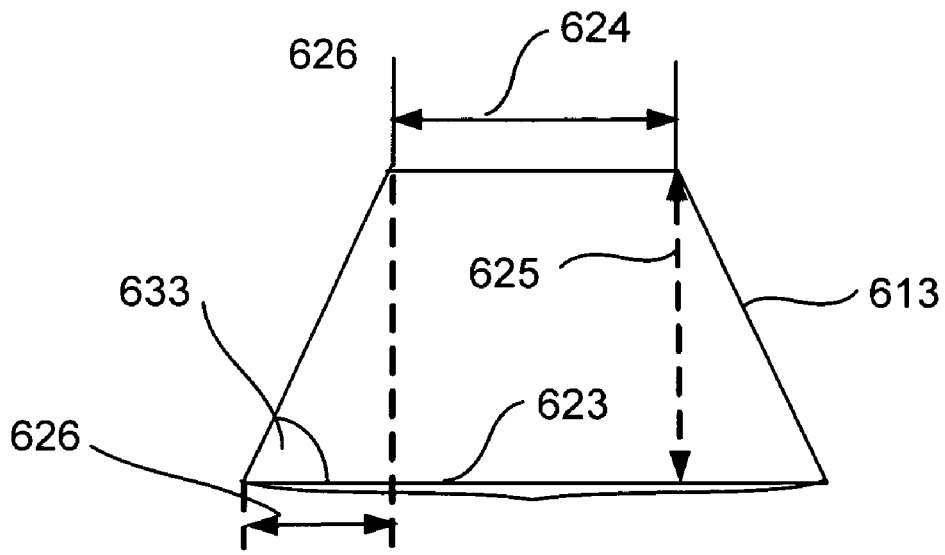
FIG. 6A is a schematic representation of a nanostructure comprising a tapered elongated body with angled side walls.

In an alternative exemplary embodiment of the invention shown in FIG. 6A, each one of the plurality of elongated bodies are shaped like but not limited to, for example a tapered cylinder represented as 600A, wherein the nominal footprint diameter (623) is larger than the nominal top end diameter (624) by an amount represented as 626. By way of example, if the nominal height is 'H', nominal footprint diameter is 'D', and the nominal top end diameter is 'd', then the difference is X=D−d. It should be understood that by varying 'X' the inclination of the side wall surface (613) may be varied. The angle of inclination (633) of the side walls depends on 'X', 'D', 'd' and 'H'. For example, as a design choice, 'X' may be made equal to zero (no inclination resulting in straight cylinders) or an integral fraction D. However, other criteria may be applied without deviating from the principles of the invention.

Figure 6B:
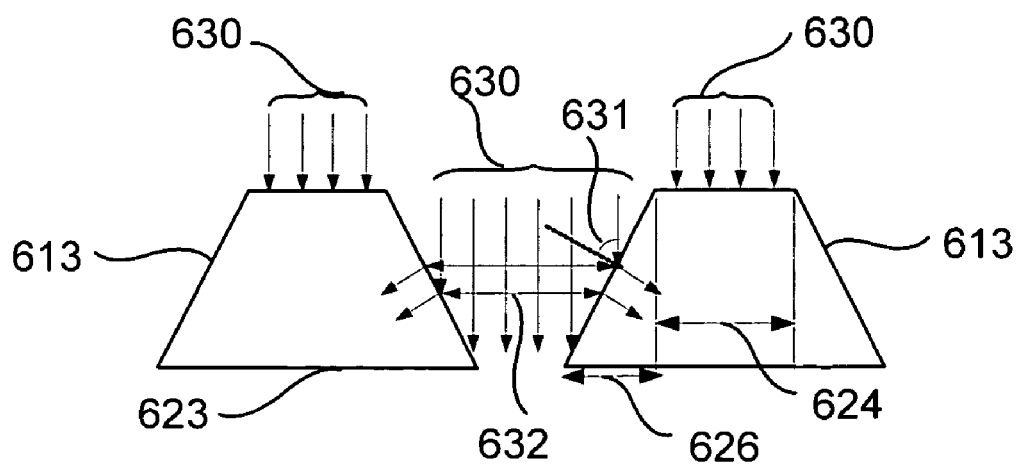
FIG. 6B shows the effect of reflection from angled side walls of the nanostructure shown in FIG. 6A that results in additional photon flux incident on a matrix material embedding the nanostructures.

One aspect of this alternative design is shown in FIG. 6B, wherein two adjacent tapered cylinders are arranged side-by-side, as it would be, in an array described earlier in reference with FIG. 5A. As can be seen from the drawing, that the photon flux (630) is incident on the top ends of the tapered cylinders as well on the embedding matrix. It should be noted that a fraction of the photon flux that is incident on the inclined surface (613) of the tapered cylinders is reflected in the direction of an adjacent tapered cylinder. Although only one direction is shown for clarity, the reflection takes place all around each one of the tapered cylinders.

The fraction of photon flux that is reflected depends on the angle of inclination (631). By carefully selecting the nominal footprint diameter (623) and the nominal top end diameter (624) the angle of inclination (631) can be optimized. By doing so, the fraction of photon flux that may be reflected in the direction of an adjacent tapered cylinder can be maximized. As the reflected portion of the photon flux traverses through the embedding matrix in between the two adjacent tapered cylinders, it is reabsorbed, and the fraction of photon flux that would have been otherwise lost due to reflection, is effectively utilized.

Effectively, the photon flux incident on the embedding matrix increases. It should be noted that the effective enhancement in the photon flux takes place all around the tapered cylinders. Those skilled in the art will appreciate that due to the effective enhancement in the incident photon flux, relatively more photo-carriers are generated within the embedding matrix in the hybrid device as compared to a prior art planar photovoltaic device shown in FIG. 2. Therefore the hybrid device designed according to the principles of this invention exhibits higher efficiency.

Figure 7:
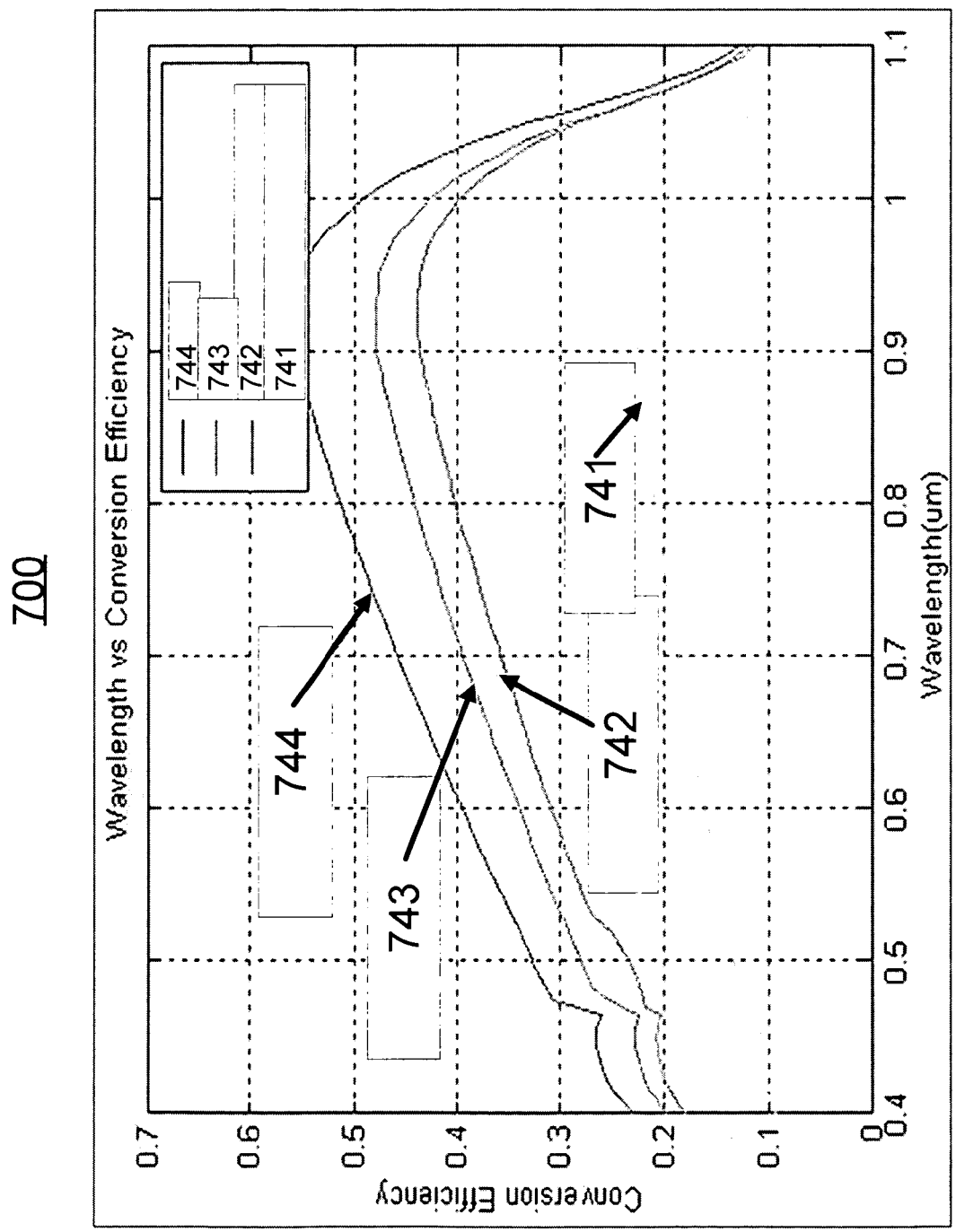
FIG. 7 represents a simulation result of conversion efficiency as affected by angled side walls of a hybrid device constructed according to the principles of this invention.
Figure 8:
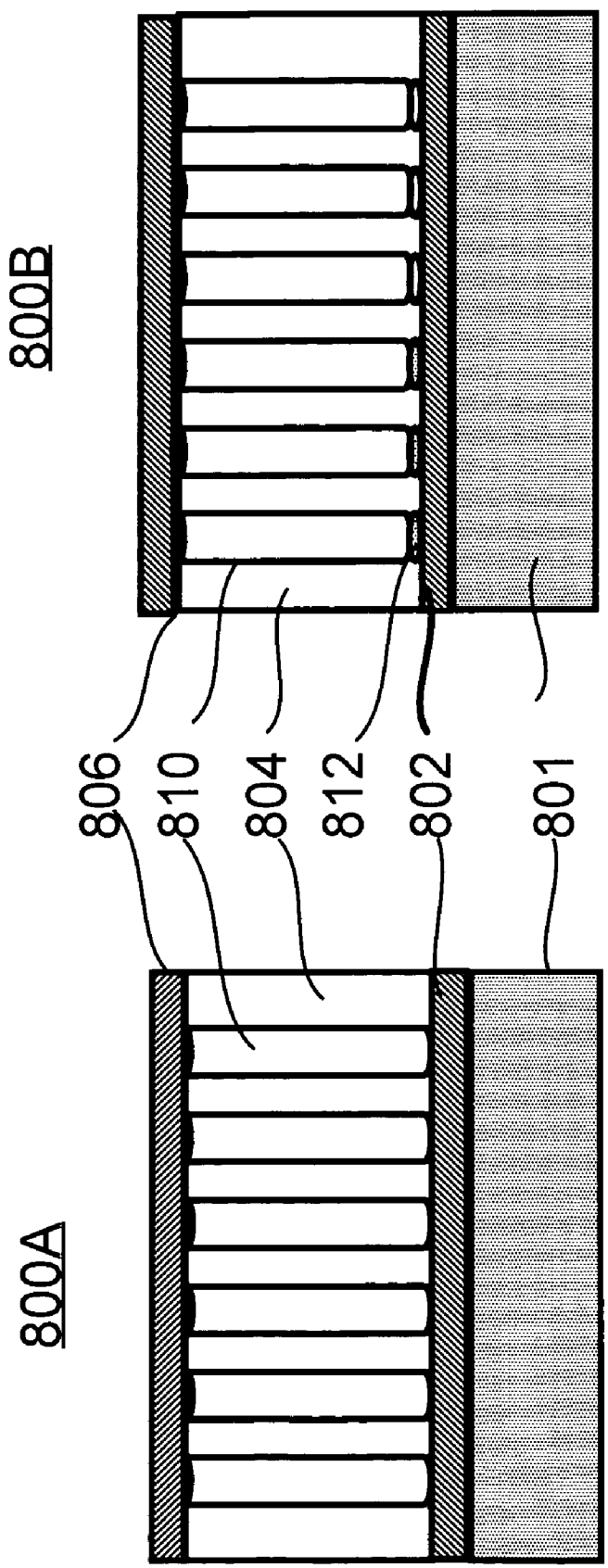
FIG. 8 is a schematic representation of alternative embodiments of hybrid devices according to the principles of the invention.

Referring simultaneously to FIGS. 6A and 7, the effect of enhanced incident photon flux is shown in a graph 700, wherein simulated conversion efficiency is plotted as a function of wavelength of the incident photons. Four traces (741-744) shown in the graph represent tapered cylinders (shown in FIG. 6A) having different inclinations of the surface (613). More specifically, in this example traces 741-744 are plotted with 'X' equal to 0, D/16, D/4, and D/2, respectively.

It should be noted that keeping the nominal height and the nominal footprint diameter (625 and 623, respectively, in FIG. 6A) of the tapered cylinders constant, as X decreases the inclination of the surface increases. For example, for X=0 there is no inclination of the surface and the tapered cylinder is effectively like a straight cylinder. A careful observation of the graph 700 reveals that the peak efficiency of the hybrid device increases by a factor of 1.5 or more, when 'X' is equal to D/2 (trace 744) as compared to, when 'X' is equal to zero (trace 741). In short, higher inclination of the surface is beneficial for increasing the efficiency of the hybrid device.

Those skilled in the art will appreciate that by carefully selecting the parameters of the nanostructures, the hybrid device constructed according to the principles of the invention has a number of advantages including but not limited to, a) utilizing a wider section of the solar spectrum, b) enhanced surface area for more light absorption, c) enhanced absorption of light from the incident photon flux due to the inclination of the surface, and d) additional built-in electric field of the plurality of surface junctions at the interface of the plurality of nanostructures and the embedding matrix. As a result, efficiency of the hybrid photovoltaic device is higher as compared to a prior art planar photovoltaic device shown in FIG. 2.

Referring again to FIG. 3, the nanostructures (310) may be constructed directly over the first layer. In that case, the material utilized for constructing the nanostructures has to be compatible with the first layer, such that the first layer forms the substrate for the growth of nanostructures. This requirement limits the choice of materials that may be compatibly utilized to construct the hybrid device.

In order to have a wider choice of materials for constructing the hybrid device it is desirable to relax the compatibility requirement. In an alternative embodiment, the nanostructures are grown separately on a different substrate, and subsequently transferred on to the transparent conductor layer (302). In that case, simplified hybrid devices may be constructed resulting in two different embodiments, schematically shown in FIGS. 8A and 8B, where like parts are indicated by like reference numerals.

Referring now to FIGS. 8A and 8B, hybrid devices according to two alternative embodiments are represented as 800A and 800B. The basic structure is similar in both these embodiments and only one of them will be described for clarity. It can be seen that the hybrid device 800A comprises a layer of transparent conductor (802) deposited over a substrate (801), nanostructures (810) embedded in a matrix of another material exhibiting photovoltaic effect (804), wherein the embedding matrix comprises a single layer. The layer of transparent conductor forms a first electrode, and a metal layer (806) deposited over the top end of the plurality of nanostructures forms a second electrode of the hybrid device.

It should be noted that in the hybrid device 800B, the nanostructures include optional metal catalyst layers (812) positioned directly underneath each one of the nanostructures. Each ones of the metal catalyst layers (812) electrically connects respective ones of the nanostructures with the transparent conductor layer (802).

The alternative hybrid devices 800A and 800B functions in substantially similar manner and has all the advantages of the hybrid device described in reference with FIGS. 3, 4, 5, 6A and 6B. The only difference is that in the alternative hybrid devices 800A and 800B the nanostructures are supported directly on the transparent conductor layer, and the embedding matrix comprises a single layer (804), whereas in the hybrid photovoltaic device described earlier, the nanostructures are supported on a first layer (403), and the embedding matrix comprises more than one layer (for example 404 and 405). It should be noted that the hybrid devices described in FIG. 8 eliminate the need for two layers (403 and 405 shown in FIG. 4), and yet have same advantages as those described for the hybrid device in reference with FIGS. 3, 4, 5A, 5B, 6A and 6B.

Advantages of the hybrid devices described in the previous sections include but are not limited to, a) utilizing a wider section of the solar spectrum from the incident photon flux, b) enhanced absorption of photon flux, c) increased photo-carrier generation, d) better separation of photo-carriers in planar and surface p-i-n and p-n junctions respectively, e) efficient diffusion of carriers to the respective electrodes, and f) efficient collection of photo-carriers by the respective electrodes. A combination of all these factors result in higher efficiency of the hybrid devices as compared to its prior art planar counterpart (FIG. 2).

Those skilled in the art will appreciate that the design choices described in the embodiments are only illustrative and other variations to the design may be made without deviating from the basic principles of the invention. It can be further appreciated that without deviating from the principles of the invention, the exemplary embodiments described earlier may be altered such that the incident photon flux illuminates the photovoltaic devices from the top surface instead from the bottom surface. It can also be appreciated that the choice of materials to construct the exemplary embodiments are not limited to the specific materials described therein and may be altered for different illumination schemes, different construction processes, and compatibility with other steps involved in constructing the hybrid device. Many other design choices that may be made to optimize the performance of the hybrid devices without deviating from the basic principles of the invention will now be discussed.

The choice of materials is one of many important aspects in constructing a hybrid device according to the principles of the invention. Methods to construct different sections of the hybrid devices that are well known and well documented in the art include but are not limited to, physical vapour deposition such as, sputtering, vacuum thermal evaporation, chemical deposition such as, chemical vapour deposition (CVD), metal-organic chemical vapour deposition (MOCVD), epitaxy, electroplating, electroless plating and a combination of these methods thereof. Those skilled in the art know that these methods are selected depending upon individual sections to be constructed and materials utilized in constructing individual sections of the hybrid device. Compatibility between the selected method and material for each section is very important. It is also important that methods of construction and materials utilized for individual section are compatible with the construction of other sections. All these and other criteria are well documented in the art and will not be discussed further.

In this section several exemplary methods of construction will be described for illustrative purposes. In particular, methods of construction for the exemplary hybrid devices shown in FIGS. 3, 8A and 8B are shown as sequences of process steps in FIGS. 9, 10 and 11, respectively. More specifically, in FIG. 9 the process steps a-f describe construction of each section of the hybrid device shown in FIG. 3. For convenience, like parts are indicated by like reference numerals and sequence of steps is marked with solid arrows as well. For keeping the illustration simple, in each step the reference numeral indicates only the section constructed in that step.

Figure 9:
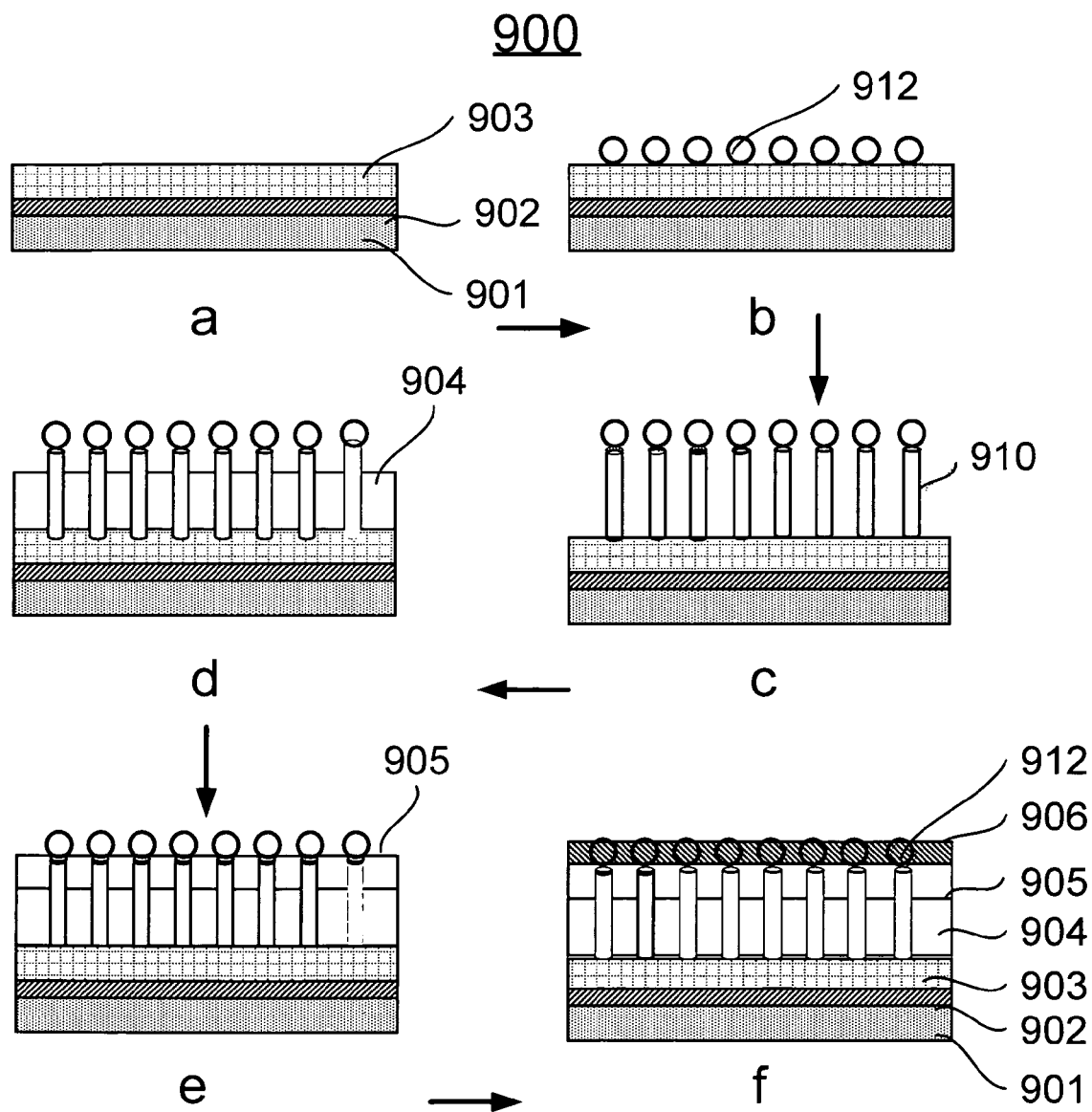
FIG. 9 is a schematic representation of a fabrication process for constructing a hybrid device according to the principles of this invention.

Referring simultaneously to FIGS. 3 and 9, step 'a' shows deposition of the transparent conductor layer (302, 902), and the first layer (303, 903) over the substrate (301, 901), preferably by a CVD process. This forms the support structure for constructing the nanostructures (310, 910). Prior to constructing the nanostructures, an array of a plurality of discrete metal catalyst layers (912) are deposited over the first layer, preferably by a physical vapour deposition in step 'b'. The array may be created by applying a mask during the metal catalyst layer deposition, or by selectively etching away material from a uniformly deposited layer. These techniques are well documented in the art and will not be discussed further. The plurality of discrete metal catalyst layers serve as nucleation sites for respective ones of the nanostructures. The nanostructures are grown in step 'c' for example, by a chemical vapour deposition process.

In the next steps 'd' and 'e', the matrix embedding the nanostructures is constructed by depositing preferably by chemical vapour deposition, one or more layers (304, 305 and 904, 905) of another material exhibiting photovoltaic effect. In the last step 'f' a metal layer (306 and 906) is deposited preferably by physical vapour deposition, or electroplating to complete the hybrid device. It should be noted that the finished hybrid device as shown in step 'f' is substantially similar to the hybrid device as shown in FIG. 3.

It can be appreciated that the sequence of steps described here are merely illustrative and may be altered according to the number of sections required in the hybrid device in various embodiments of the invention. For example, FIGS. 10 and 11 in steps a-f, illustrate two slightly different processes that may be used to construct the two embodiments 800A and 800B, respectively, shown in FIG. 8. For convenience, like parts are indicated by like reference numerals, and in each step only the section constructed in that step is indicated. A method of constructing each step may be similar or different from the one used in the counterpart steps described in reference with FIG. 9, depending upon the exact details of the section being constructed.

Figure 10:
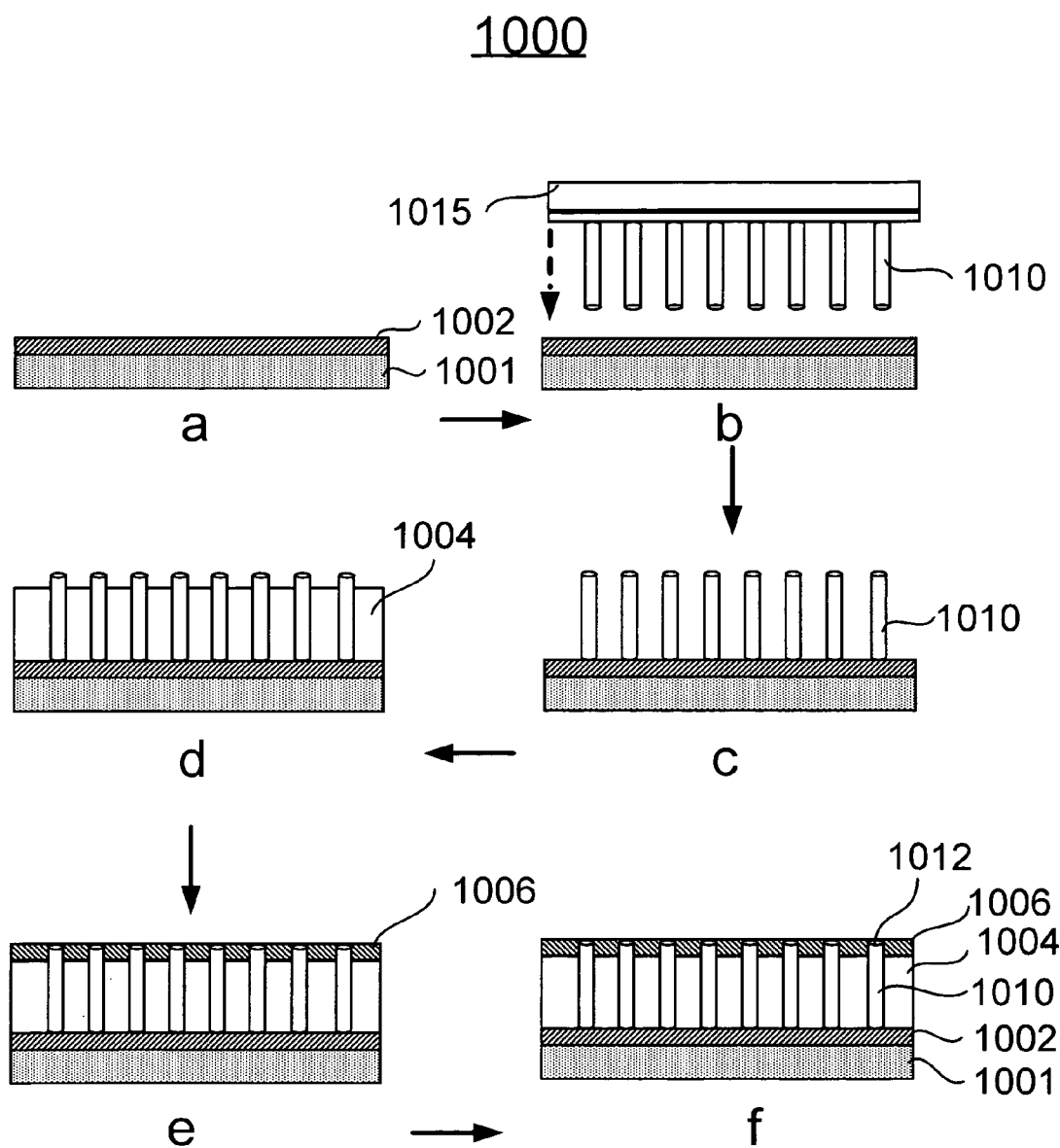
FIG. 10 is a schematic representation a fabrication process for constructing a first alternative embodiment of a hybrid device according to the principles of this invention.
Figure 11:
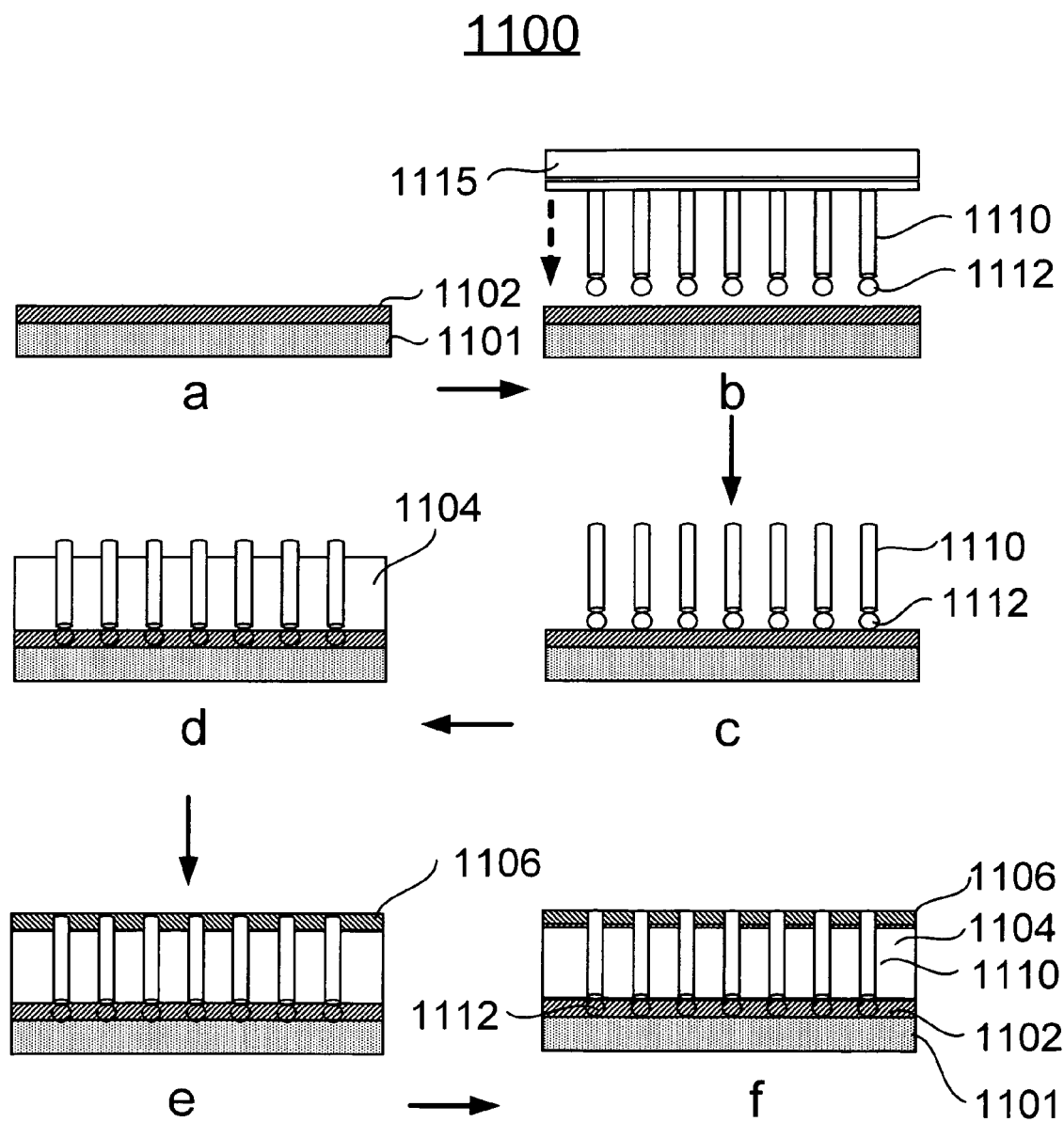
FIG. 11 is a schematic representation of a fabrication process for constructing a second alternative embodiment of a hybrid device according to the principles of this invention.

It should be noted that the steps shown in the FIGS. 10 and 11 are meant to be illustrative only and other alterations are possible without deviating from the basic principles. More specifically and referring to FIG. 10, in step 'a' a conducting layer (1002) is deposited on a substrate (1001). In this example, the nanostructures are not grown over the conducting layer. Instead pre-fabricated nanostructures grown on a foreign substrate (1015) are transferred on to the conducting layer in steps 'b' and 'c'. In step 'd', the matrix (1004) is constructed for embedding the nanostructures. Notably, in this example, the matrix comprises a single layer. Finally, in step 'e' a metal layer is deposited over the matrix and the nanostructures to finish the hybrid device. The complete hybrid device shown in step 'f' is identical to the hybrid device 880A shown in FIG. 8.

The process steps illustrated in FIG. 11 are substantially similar to those described in reference with FIG. 10. The only difference is that in FIG. 11 step 'b' and 'c', the nanostructures are transferred together with the metal catalyst layers (1112) attached to the bottom ends of each one of the nanostructures. In the finished hybrid device constructed according to this process sequence, the metal catalyst layer electrically connects the nanostructures to the conducting layer (1102) as shown in step 'f', and also in the hybrid device 800B in FIG. 8.

Those skilled in the art will appreciate that utilizing pre-fabricated nanostructures allows a designer a number of different choices or flexibility for selecting materials that may be used for constructing the nanostructure. For example, it allows eliminating a first layer (903 shown in step 'a' in FIG. 9), thereby relaxing the compatibility requirement between the two materials to be utilized for growing the nanostructures over a layer that is already deposited. It further allows a choice of a substrate material that is not transparent, such as a semiconductor, ceramic, or polymer. Therefore this embodiment of the hybrid device is adaptable for top illumination scheme. A point to note is that the hybrid devices constructed according to the process steps illustrated in FIGS. 10 and 11 utilizes less number of sections thereby eliminating additional steps of constructing the sections 903 and 905 shown in steps 'a' and 'e' in FIG. 9.

One design choice is to utilize a transparent conductor on a transparent foreign substrate (1015 in FIG. 10) such that the foreign substrate is retained over the nanostructures thereby, forming the first electrode, whereas the substrate (1001) with the conducting layer (1002) forms the second electrode. These are only a few illustrative examples of design choices that may be exercised within the basic principles of the invention, and those skilled in the art may like to alter them without deviating from the basic principles.

Different combination of materials may be utilized depending upon the illumination scheme (for example, bottom illumination or top illumination), compatibility with the sections to be constructed in each subsequent step, and the methods to be utilized for the construction. These and other issues related to selection of materials will be described next. Referring again to FIG. 3, the substrate (301) is the one selected from glass, sapphire, ceramic, semiconductor or polymer.

The substrate may be uniform or may include special surface features, such as grooves, that may be necessary to construct the next section overlying the substrate. Choice of top or bottom illumination scheme is another important factor that governs the selection between a transparent, opaque or semi-transparent substrate. The temperature to be used in subsequent process steps is another important governing factor. As mentioned earlier, the methods for constructing the hybrid devices are well known to those skilled in the art and the illustrative examples described here are merely guidelines for constructing a hybrid device according to the principles of the invention.

Different materials that can be utilized for the first and second electrodes namely, the transparent conducting layer (302) and the metal layer (306) include but are not limited to materials well known in the art such as, conducting transparent oxides (CTO) including indium tin oxide (CTO), metals including gold, silver, platinum, palladium, titanium zinc, and their alloys, refractory materials including tungsten, molybdenum, tungsten silicide, etc.

Construction of the nanostructures and the matrix utilizes materials that include but are not limited to, semiconductors, or photosensitive polymers that are well known in the art. The semiconductors include but are not limited to, single crystalline, microcrystalline, polycrystalline or amorphous forms of elemental semiconductors, crystalline III-V alloy semiconductors, crystalline, polycrystalline or amorphous II-VI alloy semiconductors. They may be thin films or epitaxial layers. The specific materials and their forms in these categories are well documented in the art, and are too numerous to list here. For example, the first second and third layers (303-305) shown in FIG. 3 may be constructed from c-Si, micro-Si, poly-Si, and a-Si. Alternatively, they may be constructed from III-V alloy semiconductors such as GaAs, InP, GaAlAs, GaInAsP, GaInAs, or any combination thereof, or they may be constructed from a photosensitive polymer.

The nanostructures may be constructed either along with the rest of the hybrid device or it may be pre-fabricated on a foreign substrate and transferred to the substrate on which the hybrid device is being constructed. Either way, all the materials listed for constructing the matrix may be used to construct the nanostructures as well. However, for maximizing the benefits of the structural aspects of the invention thereby improving the efficiency, a material utilized for constructing the nanostructures must be different than a material utilized for constructing the matrix embedding the nanostructures.

Those skilled in the art will appreciate that within this framework of selecting different materials and processes for constructing the hybrid device, many variations are possible that are too numerous to list here. It should be understood that the efficiency of the hybrid device is high due to a combination of the nanostructures embedded in the matrix constructed from a different material exhibiting photovoltaic effect, and the distinguishing structural aspects.

While the choice of materials is important structural aspects of the hybrid device also play an important role in improving the absorption of light over a larger section of the solar spectrum, reducing the reflection loss at the surface, enhanced surface area for better collection and absorption of light, enhanced photo-carrier generation, better separation of photo-carriers assisted by the built-in field of the surface junctions, longer diffusion length of photo-carriers in the nanostructures, and efficient collection of the photo-carriers at the respective electrodes.

The full extent of these and other advantages of the hybrid device constructed according to the principles of the invention can be appreciated by the scope of accompanying claims.

What is claimed is:

1. A hybrid photovoltaic device comprising:
a plurality of layers including:
- a substrate having a bottom and a top surface;
- a first conducting layer overlying the top surface of the substrate, wherein the first conducting layer forms a first electrode;
- a first layer overlying the first conducting layer;
- a plurality of nanostructures arranged in a two dimensional array, wherein the plurality of nanostructures is supported on the first layer, and wherein each one of the nanostructures project vertically upwards from a surface of the first layer;
- a matrix including:
  - a second layer overlying the first layer, wherein the second layer surrounds the plurality of nanostructures, and substantially fills the space between portions of the nanostructures proximate to the first layer, such that the plurality of nanostructures is partially embedded in the second layer, and
  - a third layer overlying the second layer, wherein the third layer surrounds the plurality of nanostructures, and substantially fills the remaining space between each one of the nanostructures to the top of the nanostructures,
  wherein the first, second and third layers collectively form a planar charge separation region, such that the plurality of nanostructures is embedded in the matrix including the charge separation region; and
- a second conducting layer overlying the third layer, wherein the second conducting layer forms a second electrode having an opposite polarity from that of the first electrode;
- such that in response to an incident photon flux, the plurality of nanostructures and the matrix absorb photons having different energies according to their respective band-gaps, wherein a plurality of photo-carriers is generated within the nanostructures and the matrix, respectively, of the hybrid photovoltaic device, wherein each one of the photo-carriers has an electric charge, positive or negative, but not both, and said photo-carriers are collected according to their respective charges at the first and second electrodes, respectively, thereby generating an electric current.

2. The hybrid photovoltaic device of claim 1, wherein the substrate material includes one selected from a group consisting of glass, sapphire, semiconductor, metal, ceramic and polymer.

3. The hybrid photovoltaic device of claim 1, wherein the first and second conducting layers are constructed from a material including, one selected from a group consisting of a conducting transparent oxide, indium tin oxide, and metal.

4. The hybrid photovoltaic device of claim 1, wherein the first, second and third layers, and the plurality of nanostructures are each constructed from a different photosensitive material, including one selected from a group consisting of an elemental semiconductor, a III-V alloy semiconductor, a II-VI alloy semiconductor and a photosensitive polymer, such that the plurality of nanostructures are constructed from a material different than the first, second and third layers.

5. The hybrid photovoltaic device of claim 4, wherein the photosensitive materials include one selected from a group consisting of crystalline, microcrystalline, polycrystalline, and amorphous materials.

6. The hybrid photovoltaic device of claim 1, wherein one or more of the first, second and third layers are constructed from the same photosensitive material including one selected from a group consisting of an elemental semiconductor, a III-V alloy semiconductor, a II-VI alloy semiconductor and a photosensitive polymer.

7. The hybrid photovoltaic device of claim 1, wherein the plurality of nanostructures and the matrix form a plurality of surface junctions at their respective interfaces.

8. The hybrid photovoltaic device of claim 1, wherein each one of the plurality of nanostructures has a nominal height and a nominal footprint diameter, and wherein the nominal height is substantially larger than the nominal footprint diameter, such that the total surface area of the plurality of the nanostructures is substantially larger than the total footprint area of the plurality of nanostructures.

9. The hybrid photovoltaic device of claim 8, wherein the plurality of nanostructures includes one selected from a group consisting of nanocylinders, nanopillars and nanowires.

10. The hybrid photovoltaic device of claim 1, wherein the plurality of nanostructures is a plurality of tapered cylinders, each one having a nominal height, a nominal footprint diameter, and a nominal top end diameter, wherein the nominal top end diameter is smaller than the nominal footprint diameter, preferably by an integral fraction of the nominal footprint diameter, such that the plurality of tapered cylinders have inclined surfaces along the length of the plurality of tapered cylinders such that the incident photons that are not absorbed are reflected off of the inclined surfaces back into the matrix region where they are reabsorbed and generate additional photo-carriers.

11. The hybrid photovoltaic device of claim 1, wherein one or more of the first, second, and third layers, and the plurality of nanostructures are doped, and wherein the doping in one or more of the first, second, and third layers, and the plurality of nanostructures is graded.

12. The hybrid photovoltaic device of claim 1, wherein the substrate includes a periodic pattern, such that the hybrid device is constructed on substrate having a periodic non-uniformity in thickness.

13. A hybrid photovoltaic device comprising:
a plurality of layers including:
- a transparent substrate having a bottom and a top surface;
- a first transparent conducting layer overlying the top surface of the substrate, wherein the first conducting layer forms a first electrode;
- a first amorphous semiconductor layer overlying the first transparent conducting layer;
- a plurality of nanostructures arranged in a two dimensional array, wherein the plurality of nanostructures are constructed from a III-V alloy semiconductor and supported on the first amorphous semiconductor layer, and wherein each one of the nanostructures project upwards from a surface of the first amorphous semiconductor layer;
- a matrix including:
  - a second amorphous semiconductor layer overlying the first amorphous semiconductor layer, wherein the second amorphous semiconductor layer surrounds the plurality of nanostructures, and substantially fills the space between portions of the nanostructures proximate to the first amorphous semiconductor layer, such that the plurality of nanostructures is partially embedded in the second amorphous semiconductor layer, and
  - a third amorphous semiconductor layer overlying the second amorphous semiconductor layer, wherein the third amorphous semiconductor layer surrounds the plurality of nanostructures, and substantially fills the remaining space between each one of the nanostructures to the top of the nanostructures, wherein the first, second and the third layers collectively form a planar charge separation region such that the plurality of nanostructures is embedded in the matrix including the planar charge separation region; and a second conducting layer overlying the third layer, wherein the second conducting layer forms a second electrode having an opposite polarity from that of the first electrode;

such that in response to a photon flux incident at the bottom surface of the transparent substrate, the plurality of nanostructures and the matrix absorb photons having different energies according to their respective bandgaps, wherein a plurality of photo-carriers is generated within the nanostructures and the matrix, respectively, of the hybrid photovoltaic device, wherein each one of the photo-carrier has an electric charge, positive or negative, but not both, and said photo-carriers are collected according to their respective charges at the first and second electrodes, respectively, thereby generating an electric current.

14. The hybrid photovoltaic device of claim 13, wherein the amorphous semiconductor is amorphous silicon (a-Si), and wherein the III-V alloy semiconductor is indium phosphide (InP).

15. A method of generating electric current by a hybrid photovoltaic device of claim 1, said method comprising the steps of:
 absorbing photons from an incident photon flux, said step of absorbing photons taking place in the plurality of nanostructures embedded in the matrix;
 generating a plurality of photo-carriers in response to said step of absorbing photons, wherein each one of said photo-carriers generated in the plurality of nanostructures and the matrix, has an electric charge, positive or negative, but not both;
 separating photo-carriers, wherein said step of separating taking place in a plurality of surface junctions formed at the interface of the plurality of nanostructures and the matrix;
 collecting photo-carriers, wherein said step of collecting taking place in the first and the second electrode having opposite polarities, respectively, and wherein said collecting taking place according to the charge on each one of the plurality of photo-carriers; and
 generating the electric current by said collecting of carriers.

16. A hybrid photovoltaic device comprising:
 a plurality of layers including:
 a substrate having a bottom and a top surface;
  a first conducting layer overlying the top surface of the substrate, wherein the first conducting layer forms a first electrode;
 a first layer overlying the first conducting layer wherein the first layer is of a doping type of either P or N;
 a plurality of nanostructures arranged in a two dimensional array, wherein the plurality of nanostructures is supported on the first layer, and wherein each one of the nanostructures project vertically upwards from a surface of the first layer;
 a matrix including:
 a second layer overlying the first layer, wherein the second layer surrounds the plurality of nanostructures, and substantially fills the space between each portions of the nanostructures proximate to the first layer, such that the plurality of nanostructures is partially embedded in the second layer and the second layer has very low or no doping, and
 a third layer overlying the second layer, wherein the third layer surrounds the plurality of nanostructures, and substantially fills the remaining space between each one of the nanostructures to the top of the nanostructures and is either of the same or opposite doping type as the first layer,
 wherein the first, second and the third layers collectively form a planar charge separation region such that the plurality of nanostructures is embedded in the matrix including the planar charge separation region; and
 a second conducting layer overlying the third layer, wherein the second conducting layer forms a second electrode having an opposite polarity from that of the first electrode;
 such that in response to an incident photon flux, the plurality of nanostructures and the matrix absorb photons having different energies according to their respective bandgaps, wherein a plurality of photo-carriers is generated within the nanostructures and the matrix, respectively, in the hybrid photovoltaic device, wherein each one of the photo-carriers has an electric charge, positive or negative, but not both, and said photo-carriers are collected according to their respective charges at the first and second electrodes, respectively, thereby generating an electric current.

* * * * *